United States Patent
Pichot

(10) Patent No.: US 9,698,456 B2
(45) Date of Patent: Jul. 4, 2017

(54) TERMINATION ELEMENT FOR FILL LEVEL MEASURING DEVICE AND FILL LEVEL MEASURING DEVICE

(71) Applicant: KROHNE S.A.S., Romans-sur-Isère (FR)

(72) Inventor: Vincent Pichot, Romans-sur-Isere (FR)

(73) Assignee: Krohne S.A.S., Romans-sur-Isere (FR)

( * ) Notice: Subject to any disclaimer, the term of this patent is extended or adjusted under 35 U.S.C. 154(b) by 73 days.

(21) Appl. No.: 14/719,712

(22) Filed: May 22, 2015

(65) Prior Publication Data

US 2015/0340750 A1    Nov. 26, 2015

(30) Foreign Application Priority Data

May 26, 2014 (DE) .................. 10 2014 107 393

(51) Int. Cl.
| | |
|---|---|
| *G01R 27/04* | (2006.01) |
| *H01P 1/22* | (2006.01) |
| *H03H 7/38* | (2006.01) |
| *G01F 23/284* | (2006.01) |
| *H04B 3/52* | (2006.01) |

(52) U.S. Cl.
CPC ............. *H01P 1/222* (2013.01); *G01F 23/284* (2013.01); *H03H 7/38* (2013.01); *H04B 3/52* (2013.01)

(58) Field of Classification Search
CPC ............................. G01F 23/28–23/2928; G01F 23/2962–23/2968
USPC .................................................. 324/642, 644
See application file for complete search history.

(56) References Cited

U.S. PATENT DOCUMENTS

| | | | |
|---|---|---|---|
| 4,035,748 A | 7/1977 | Kusaka et al. | |
| 5,554,936 A * | 9/1996 | Mohr ................. | G01R 27/2658 324/446 |
| 5,748,562 A * | 5/1998 | Cherek .............. | G01F 23/2965 367/124 |
| 6,662,648 B2 | 12/2003 | Fehrenbach et al. | |
| 7,952,449 B2 | 5/2011 | Yagisawa et al. | |
| 2004/0007061 A1* | 1/2004 | Forgue ................ | G01F 23/2968 73/290 V |
| 2009/0303106 A1* | 12/2009 | Edvardsson ......... | G01F 23/284 342/124 |
| 2011/0228640 A1* | 9/2011 | Holcomb ............ | G01F 23/2963 367/99 |
| 2014/0009323 A1* | 1/2014 | Weinzierle ........... | H01Q 13/02 342/124 |
| 2014/0084944 A1* | 3/2014 | Kienzle ................ | G01F 23/284 324/642 |

(Continued)

FOREIGN PATENT DOCUMENTS

| | | |
|---|---|---|
| DE | 100 43 838 A1 | 4/2002 |
| DE | 20 2008 006 344 U1 | 11/2008 |
| EP | 0 201 298 A2 | 11/1986 |

(Continued)

*Primary Examiner* — Patrick Assouad
*Assistant Examiner* — Demetrius Pretlow
(74) *Attorney, Agent, or Firm* — David S. Safran

(57) ABSTRACT

A fill level measuring device (3) operating with the transit time method and a termination element (1) for a waveguide (2) of the fill level measuring device (3) has a carrier element (13) that is arranged between a first cylinder element (11) and a second cylinder element (12) and has an impedance-matching component (15) that is arranged on the carrier element (13).

11 Claims, 5 Drawing Sheets

(56) References Cited

U.S. PATENT DOCUMENTS

2016/0041023 A1* 2/2016 Ito .......................... H01Q 1/225
342/124

FOREIGN PATENT DOCUMENTS

| EP | 2 154 496 A1 | 2/2010 |
| EP | 2 711 673 A1 | 3/2014 |

* cited by examiner

TERMINATION ELEMENT FOR FILL LEVEL MEASURING DEVICE AND FILL LEVEL MEASURING DEVICE

BACKGROUND OF THE INVENTION

Field of the Invention

The invention relates to a termination element for a waveguide of a fill level measuring device operating with the transit time method. Furthermore, the invention relates to a fill level measuring device operating with the transit time method having a waveguide comprised of at least one outer conductor and one inner conductor for guiding electromagnetic signals.

Description of Related Art

In a fill level measuring device that operates using the transit time method, the so-called TDR (time domain reflectometry) measuring principle is used in that the transit time of electromagnetic signals led along a waveguide are evaluated. The signals are thereby sent along the waveguide—or, in particular, along at least one of the two conductors forming the waveguide—in the direction of the surface of the medium whose fill level is to be measured. If the signals strike the surface of the medium, they are then partially reflected there. The fill level of the medium can be determined using the transit time between emitting and receiving the reflected signals. The great advantage of guiding the microwave signals is that changing ambient conditions (e.g., increasing or decreasing ambient pressure, increasing or decreasing temperature) do not affect the measuring accuracy and that, additionally, the transit time of the signal is independent of the relative permittivity of the medium.

The conductors, for the most part, have an attachment end, with which they are attached to a connector or flange, and a free end facing the medium. The conductors are connected via the connector to electronics that generate the signals to be transmitted and received as well as evaluate the reflected signals.

In the fill level measurement devices described, so-called "dead zones" exist, which describe the fill level ranges of the medium in which a measurement is not possible or only possible with great inaccuracy. The cause of the "dead zones" lies in impedance jumps of the waveguide used for guiding the signals, which are formed due to mechanical construction or to geometric factors.

Thereby, a difference is made between an "upper dead zone" in the area at which the waveguide is inserted in the container, and a "lower dead zone" at the free end.

In order to deal with the problem of upper dead zones, it is provided in part that the waveguide consists of two conductors, wherein one conductor coaxially surrounds the other conductor. Such coaxial conductors have the advantage of consistent impedance over their geometric course. Additionally, such conductors can, in general, be easily matched to the impedance of the electronics downstream from the waveguide, which is often 50 Ohm.

It is known from the prior art to provide impedance-matching components, termination resistors or impedance-matching networks comprised of different electric components—resistors, capacitors, coils, etc. for the free end of the waveguide. Reference is made, for example, to European Patent Application EP 2 711 673 A1 and corresponding U.S. Patent Application Publication 2014/0084944, German Patent Application DE 100 43 838 A1 or European Patent Application EP 2 154 496 A1. In particular, in European Patent Application EP 2 711 673 A1 and corresponding U.S. Patent Application Publication 2014/0084944, it is provided that an inner conductor is extended through an end piece and that the termination resistor is located in the end piece acting as conductor.

The elements for impedance matching are, thereby, located in the area of the free end of the waveguide, and thus, are subject to process conditions.

SUMMARY OF THE INVENTION

Thus, the object of the invention is to provide a termination element that represents an alternative to the prior art.

The termination element according to the invention in which the above derived and described object is met, it initially and essentially characterized in that at least one carrier element is arranged between a first cylinder element and a second cylinder, element and that at least one impedance-matching component is arranged on the carrier element.

The first and the second cylinder element are essentially cylindrical, wherein the basic cross section is, e.g., a circle or a polygon. The side of at least one of the cylinder elements is provided with recesses and/or protrusions in one design. All in all, however, the overall impression is that of a cylinder, wherein cylinder can generally be understood to have a height greater than the extension of the base. In one design, at least one cylinder element has a foot on at least one end face, the foot having a greater or smaller outer circumference than the cylinder that describes the corresponding cylinder element.

In one design, the first and/or the second cylinder element is/are electrically conductive. In one design, the first and second cylinder elements are connected to one another electroconductively. If at least the first cylinder element is electroconductively connected to a conductor of the waveguide, then the electromagnetic signals from the conductor are also transmitted via both cylinder elements. Alternatively, only one cylinder element is connected to a conductor of the waveguide.

If, in the mounted state, the two cylinder elements represent an extension or a sort of end piece of the inner conductor, then the at least one impedance matching component is located on the carrier element outside of this extension and, in particular, also to the side of the longitudinal axis of the inner conductor.

In one design, the carrier element is designed as a printed circuit board and, in a further design, has at least one printed circuit board.

The impedance-matching component, in one design, is at least one electric component and, in a further design, forms a part of a matching network.

In one design, a cup element is provided, the cup element having a recess for at least partially accommodating the first cylinder element, the cup element having an inner space with an inner circumference following the recess and the carrier element being arranged in the inner space of the cup element.

In one design, the cup element is rotationally symmetric. In a further design, the cup element has a hole-like recess. In another design, the inner space of the cup element is designed essentially circular.

A plug element is provided in one design. The plug element has a recess for at least partially accommodating the second cylinder element.

In one design, the cup element and the plug element are solidly attached to one another. This occurs, for example, using welding, adhesion, or by bolting. A form and/or force fit connection is created thereby.

If the cup and plug elements are solidly attached to one another, they protect the carrier element and, in particular, the at least one impedance-matching component. Fitting structures are to be provided for the connection between the impedance-matching component and the conductors of the waveguide.

Furthermore, an overall compact termination element that can be immediately mounted and only needs to be connected or attached to the waveguide further ensues. This considerably simplifies the production of fill level measuring devices.

In one design, the plug element has a central section arranged in the inner space of the cup element. In one design, the plug element is designed rotationally symmetrically. In a further design, the plug element has a hole-like recess.

In a further design, the plug element has a supporting section, wherein an outer diameter of the supporting section is greater than the inner diameter of the inner space of the cup element. In one design, the supporting section borders on the central section.

In one design, the impedance-matching component is arranged on the side of the carrier element facing away from the plug element. Thus, the impedance-matching component is located between the floor of the cup element and the carrier element. The plug element is additionally located above the carrier element. The impedance-matching component is preferably located outside of the cylinder element and, moreover, preferably, is arranged at the side of the cylinder elements due to the design and arrangement of the carrier element.

It is provided in one design that the first cylinder element has at least one blind bore. In an alternative or additional design, it is provided that the second cylinder element has at least one blind bore.

In one design, a recess for at least one sealing element is provided between the first cylinder element and the cup element. The sealing element is, for example, an O-ring. At least one recess for at least one sealing element is provided between the second cylinder element and the plug element in an additional or alternative design.

At least one recess for accommodating at least one sealing element is provided in both designs. Thereby, the transition between a cylinder element and the respective surrounding component—i.e., cup element or plug element—is sealed by the sealing element.

In one design, the first cylinder element and the second cylinder element are arranged flush and mirror symmetrically to the carrier element.

According to a further teaching, the invention relates to a fill level measuring device operating with the transit time method having at least one waveguide formed of an outer conductor and an inner conductor for guiding electromagnetic signals, characterized at least in that a termination element according to one of the above-described designs is arranged on one free end of the waveguide.

It is provided in one design that the first cylinder element is in electric contact to the inner conductor via a pin element. Furthermore, the second cylinder element is connected to a fixing element via an attaching element. Additionally, the fixing element is connected to the outer conductor via at least one further attaching element. Finally, the impedance-matching component is in electric contact with the inner conductor and the outer conductor for impedance matching.

In one design, the fixing element is connected to the outer conductor via two attaching elements, for example screws.

The fixing element, in one design, is designed similar to a bar or beam and, alternatively, is designed similarly to a plate.

In one design, the outer conductor is slanted in the area of the free end at least partially in the direction of the termination element.

In detail there is a plurality of possibilities for designing and further developing the termination element according to the invention as will be apparent from the following description of embodiments in conjunction with the drawing. The drawing shows

DETAILED DESCRIPTION OF THE INVENTION

Figure 1:
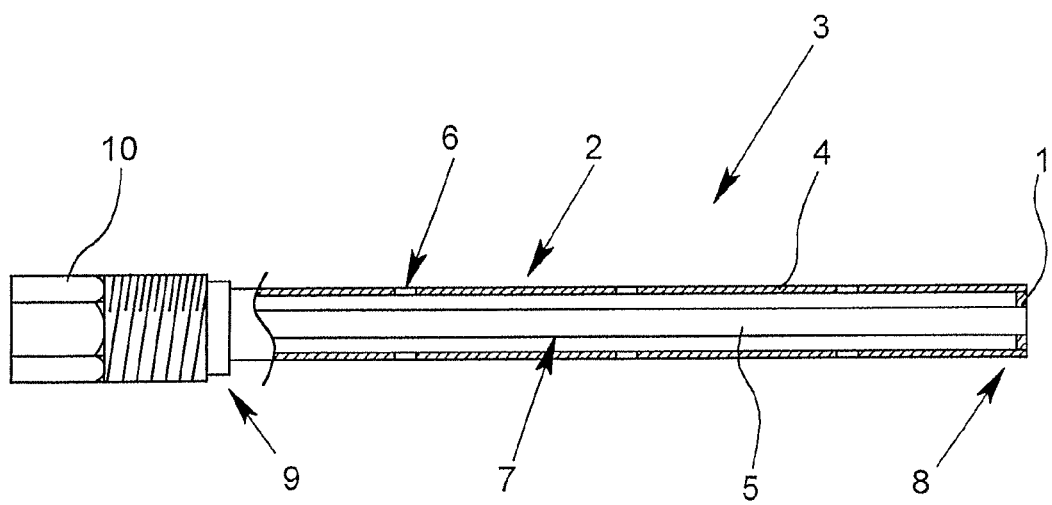
FIG. 1 is a sectional view of a schematic representation of a fill level measuring device.

A termination element 1 for the waveguide 2 of a fill level measuring device 3 is shown in FIG. 1.

Fill level measurement occurs by evaluating the transit time of electromagnetic signals that spread along the waveguide 2. An outer conductor 4, thereby, coaxially surrounds an inner conductor 5.

Holes 6 are present in the outer conductor 4, through which the medium is able to penetrate into the hollow space 7 around the inner conductor 5.

The free end 8 usually faces the medium—not shown here—during use. A connector 10 for attachment, for example, to the wall of the container encompassing the medium is provided on the opposed attachment end 9.

Figure 2:
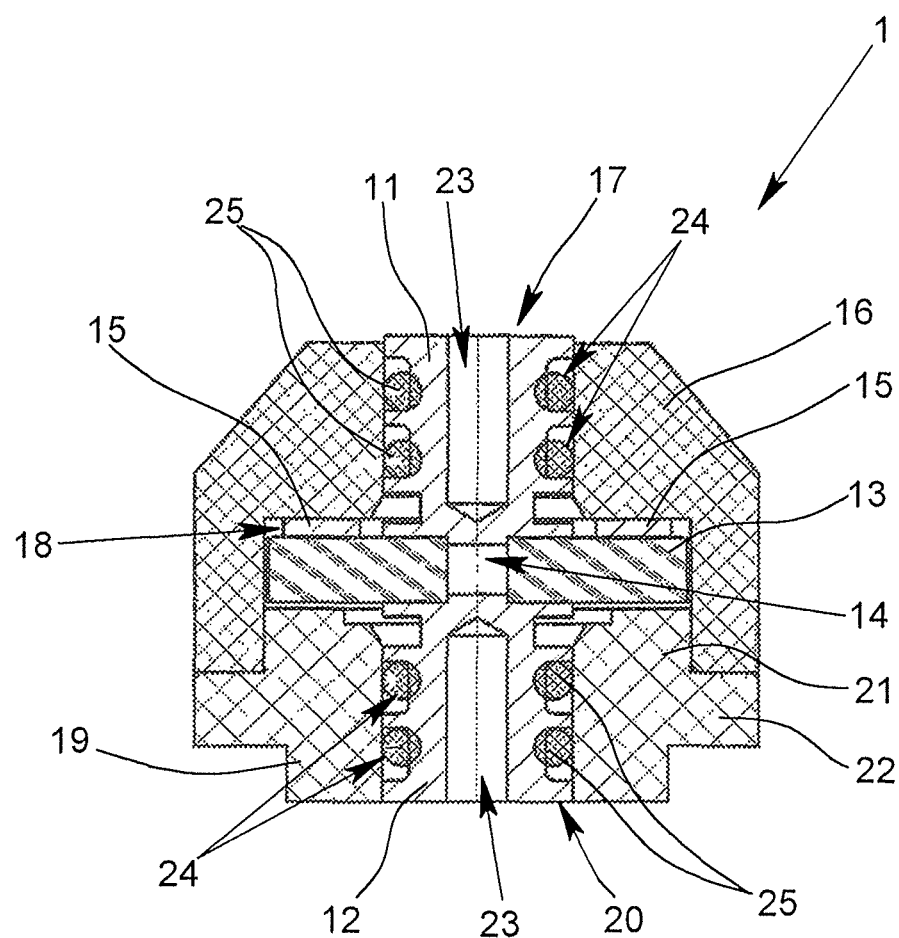
FIG. 2 is a sectional view of a schematically shows a first embodiment of a termination element.

FIG. 2 shows a cut through a termination element 1 according to a first embodiment.

The first cylinder element 11 and the second cylinder element 12 are arranged centrally and flush to one another, and in the mounted state, represent, in particular, an extension of the inner conductor. The carrier element 13 is located between the two cylinder elements, an opening 14 being present in the middle of the carrier element and the two cylinder elements 11, 12 being arranged mirror symmetrically thereto.

The cylinder elements 11, 12 extend, here, along the longitudinal axis of the termination element 1.

Two impedance-matching components 15, which are used for impedance matching of the outer and inner conductor, are located on the carrier element 13.

The carrier element 13 is located within a cup element 16, which has a hole-shaped recess 17 as well as an inner space 18 following it toward the inside. The inner space 18 is, thereby, essentially designed as a circular hollow cylinder, wherein the impedance-matching components 15 are located between the bottom wall of the inner space 18 of the cup element 16 and the carrier element 13. The impedance-matching components 15 are thus also arranged radially outward of the longitudinal axis of the termination element 1 (shown in dotted lines).

The cup element 16 is covered or closed by a plug element 19, which has a recess 20 for the second cylinder element 12 and which is plugged into the cup element 16 via a central section 21.

A supporting section 22 is provided bordering on the central section 21, the outer diameter of the supporting section corresponding to the outer diameter of the cup element 16 bordering it, and thus, is flush with it.

In the area of the supporting section 22, the plug element 19 is welded with the cup element 16 by means of laser welding. Thus, the termination element 1 forms a compact, self-contained unit that only needs to be inserted in the waveguide of the fill level measuring device.

An elevation also borders the supporting section 22 of the plug element 19 here.

A blind bore 23 is provided in the middle of each of the cylinder elements 11, 12, which have inner threading here.

On their sides, both cylinder elements 11, 12 have two circumferential recesses 24, in each of which an O-ring is provided as a sealing element 25 in order to seal the transition between the cylinder elements 11, 12 and the cup element 16 or the plug element 19.

In respect to the choice of material, the cylinder elements 11, 12 are made here of steel—or generally of an electrically conductive material—and the cup element 16 and the plug element 19 both are made of a polyetheretherketone (PEEK) as an example for an electrically insulating material.

Figure 3:
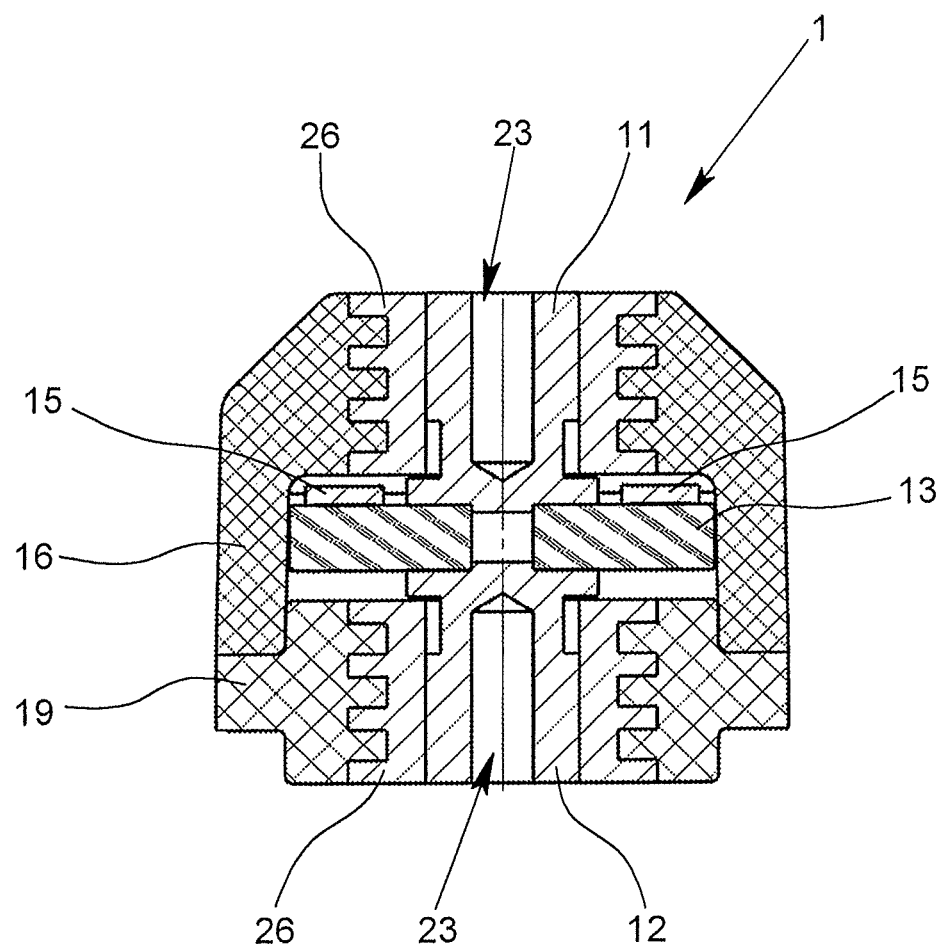
FIG. 3 is a sectional view of a second embodiment of a termination element.

A further embodiment of the termination element 1 is shown in FIG. 3, which is very similar to the variation shown in FIG. 2. Thus, a description of identical elements is not given here.

The cylinder elements 11, 12 are free of recesses on their sides and are each surrounded by a holding element 26 instead, to which they are connected by means of laser welding. The holding elements 26 have a continuous cylindrical form on the inside and have an alternating structure of projections and recesses on the outside. The holding elements 26 are, thereby, designed rotation symmetrically and inserted fittingly in the cup element 16 or the plug element 19.

Figure 4:
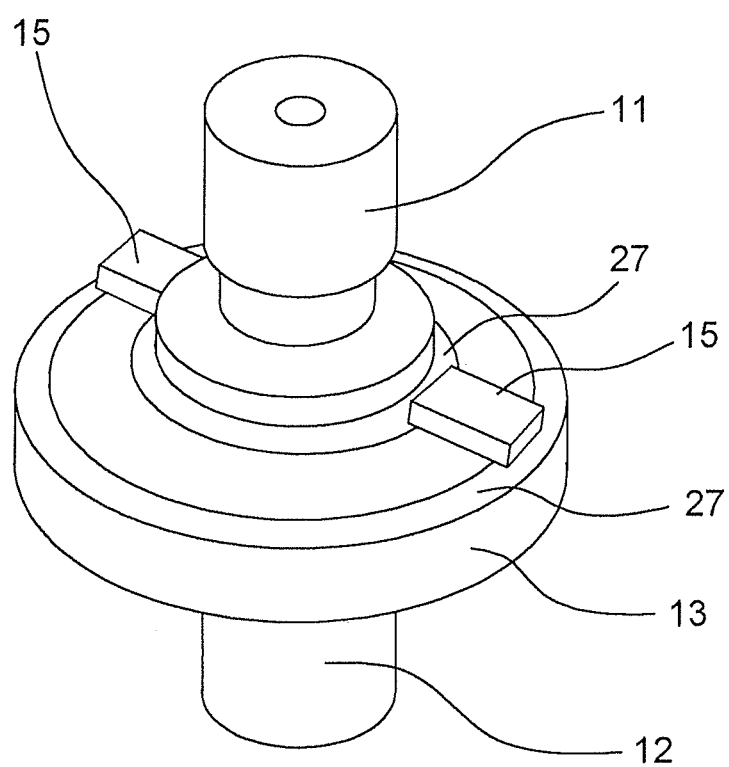
FIG. 4 is a perspective view of a part of the termination element shown in FIG. 3.

FIG. 4 shows the two cylinder elements 11, 12 and the carrier element 13 of the termination element 1 of FIG. 3.

Here, a foot below the narrowing that follows the smooth outer cylinder section can be seen on the first cylinder element 11.

The ring-shaped carrier element 13 comprises a contact surface 27 on each of the outer and inner boundary, with which the two impedance-matching components are electroconductively attached.

Figure 5:
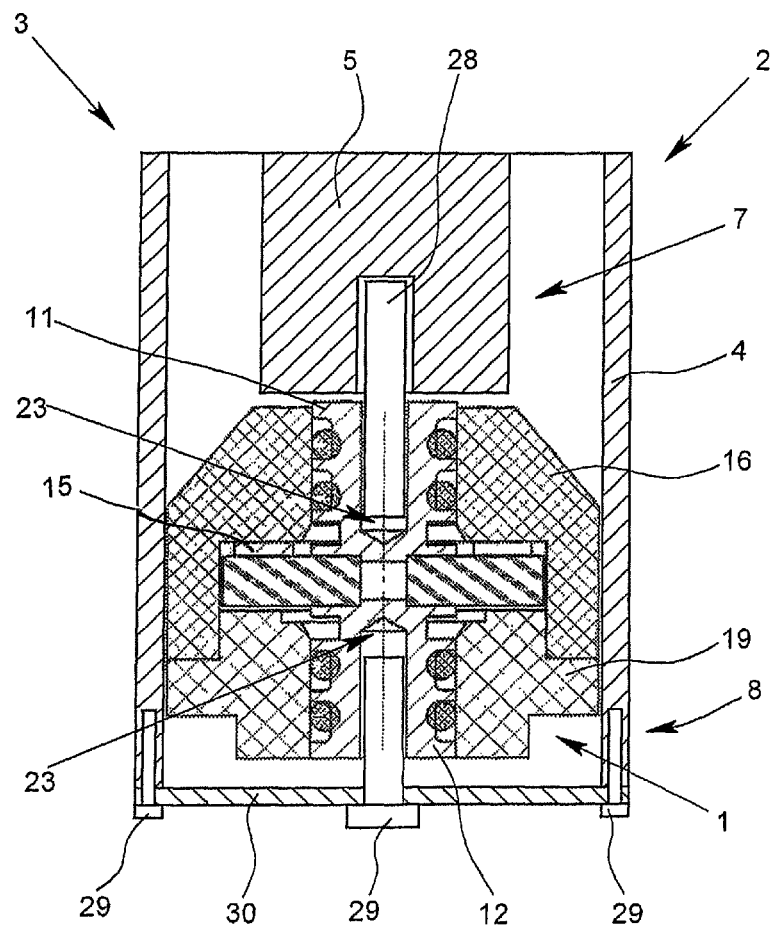
FIG. 5 is a sectional view of a section of a fill level measuring device.

FIG. 5 shows how a termination element 1 is connected to a waveguide 2.

A pin element 28, which is used for electric contact to the inner conductor 5, is located in the blind bore 23 of the first cylinder element 11.

An attachment element 29 in the form of a screw is provided in the blind bore 23 of the second cylinder element 12, wherein a fixing element 30 in the form of a beam is located between the termination element 1 and the attachment element 29. The fixing element 30 extends on the side up to the outer conductor 4, where two further attachment elements 29 implement fixation.

The two cylinder elements 11, 12 are an extension of the inner conductor 5 in the illustrated embodiment, wherein the impedance-matching components are located outside of this extension and are, here, even perpendicular to the longitudinal axis.

What is claimed is:

1. A termination element (1) for a waveguide (2) of a fill level measuring device (3) operating with the transit time method,
characterized in
that at least one carrier element (13) arranged between a first cylinder element (11) and a second cylinder element (12) and that at least one impedance-matching component (15) is arranged on the carrier element (13), that a cup element (16) is provided, and that the cup element (16) has a recess (17) for at least partially accommodating the first cylinder element (11), that the cup element (16) has an inner space (18) having an inner circumference following the recess (17) and that the carrier element (13) is arranged in the inner space (18) of the cup element (16).

2. A termination element (1) according to claim 1, characterized in that a plug element (19) is provided and that the plug element (19) has a recess (20) for at least partially accommodating the second cylinder element (12).

3. A termination element (1) according to claim 2, characterized in that the plug element (19) has a central section (21) arranged in the inner space (18) of the cup element (16) and that the plug element (19) has a supporting section (22), wherein an outer diameter of the supporting section (22) is greater than the inner circumference of the inner space (18) of the cup element (16).

4. A termination element (1) according to claim 2 characterized in that at least one recess (24) for at least one sealing element (25) is provided between at least one of the first cylinder element (11) and the cup element (16) and between the second cylinder element (12) and the plug element (19).

5. A termination element (1) according to claim 2, characterized in that the impedance-matching component (15) is arranged on a side of the carrier element (13) facing away from the plug element (19).

6. A termination element (1) according to claim 1, characterized in that at least one of the first cylinder element (11) and the second cylinder element (12) has at least one blind bore (23).

7. A termination element (1) according to claim 1, characterized in that the first cylinder element (11) and the second cylinder element (12) are arranged flush and mirror symmetrically relative to the carrier element (13).

8. A fill level measuring device (3) operating with the transit time method having a waveguide (2) comprised of at least one outer conductor (4) and one inner conductor (5) for guiding electromagnetic signals,
characterized in
that a termination element is arranged on a free termination (8) of the waveguide (2), said termination element comprising:
at least one carrier element (13) arranged between a first cylinder element (11) and a second cylinder element (12), wherein at least one impedance-matching component (15) is arranged on the carrier element, and
a cup element (16), wherein the cup element (16) has a recess (17) for at least partially accommodating the first cylinder element (11), wherein the cup element (16) has an inner space (18) having an inner circumference following the recess (17) and wherein the carrier element (13) is arranged in the inner space (18) of the cup element (16).

9. Fill level measuring device (3) according to claim 8, characterized in that the first cylinder element (11) is in electric contact with the inner conductor (5) via a pin element (28), that the second cylinder element (12) is connected to a fixing element (30) via an attaching element (29), that the fixing element (30) is connected to the outer conductor (4) via at least one further attaching element (29), and that the impedance-adapting component (15) is in electric contact with the inner conductor (5) and the outer conductor (4).

10. A fill level measuring device according to claim 9, wherein the at least one carrier element comprises a printed circuit board, and the cylinder elements are made of an electrically conductive material.

11. A termination element according to claim 1, wherein the at least one carrier element comprises a printed circuit board, and the cylinder elements are made of an electrically conductive material.

* * * * *